(12) United States Patent
Aurongzeb et al.

(10) Patent No.: US 9,016,894 B2
(45) Date of Patent: Apr. 28, 2015

(54) COLOR MIXING USING THE REFLECTIVE PROPERTIES OF OLEDS

(75) Inventors: Deeder Mohammad Aurongzeb, Mayfield Heights, OH (US); James Michael Kostka, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 365 days.

(21) Appl. No.: 13/416,400

(22) Filed: Mar. 9, 2012

(65) Prior Publication Data

US 2013/0235572 A1  Sep. 12, 2013

(51) Int. Cl.
| | |
|---|---|
| H05B 33/08 | (2006.01) |
| H05B 33/00 | (2006.01) |
| H01L 51/50 | (2006.01) |
| H01L 25/04 | (2014.01) |
| F21S 6/00 | (2006.01) |
| F21S 8/04 | (2006.01) |
| F21V 7/00 | (2006.01) |
| F21Y 105/00 | (2006.01) |
| F21Y 113/00 | (2006.01) |

(52) U.S. Cl.
CPC .......... *H01L 51/5036* (2013.01); *H01L 25/048* (2013.01); *H01L 2251/5361* (2013.01); *Y02B 20/36* (2013.01); *F21S 6/002* (2013.01); *F21S 8/04* (2013.01); *F21V 7/0008* (2013.01); *F21Y 2105/008* (2013.01); *F21Y 2113/005* (2013.01)

(58) Field of Classification Search
CPC  H01L 51/5237; H01L 51/5012; H05B 33/04; F21Y 2101/02
USPC .............. 313/504, 506, 512; 362/231; 257/40
See application file for complete search history.

(56) References Cited

U.S. PATENT DOCUMENTS

| | | | |
|---|---|---|---|
| 7,638,941 B2 | 12/2009 | Cok | |
| 7,812,515 B2 | 10/2010 | Adachi et al. | |
| 2002/0149009 A1 | 10/2002 | Uchida | |
| 2004/0105264 A1 | 6/2004 | Spero et al. | |
| 2005/0062412 A1 | 3/2005 | Taniguchi et al. | |
| 2006/0231842 A1 | 10/2006 | Hirakata et al. | |
| 2008/0191615 A1* | 8/2008 | Bechtel et al. ................ 313/504 |
| 2010/0171105 A1 | 7/2010 | Kim et al. | |

(Continued)

FOREIGN PATENT DOCUMENTS

| | | |
|---|---|---|
| JP | 2003264084 A | 9/2003 |
| WO | 2007091215 A1 | 8/2007 |
| WO | 2007107903 A1 | 9/2007 |

(Continued)

OTHER PUBLICATIONS

Search Report and Written Opinion from corresponding PCT Application No. PCT/US2013/026650 dated May 7, 2013.

*Primary Examiner* — Joseph L Williams
(74) *Attorney, Agent, or Firm* — GE Global Patent Operation; Peter T. DiMauro

(57) ABSTRACT

Color mixing using the reflective properties of an OLED is provided. At least one OLED is used to reflect light from at least one other light source such that light from the OLED and the additional light source are combined. Light from the additional light source is reflected from a surface in the OLED provided by e.g., the cathode of the OLED. By carefully selecting the individual light colors of the OLED and the additional light source, their combined light can provide a light color different from either the OLED or the additional light source alone.

13 Claims, 2 Drawing Sheets

(56) References Cited

U.S. PATENT DOCUMENTS

2011/0249425 A1   10/2011   Aurongzeb et al.
2012/0049723 A1   3/2012   Lee et al.

FOREIGN PATENT DOCUMENTS

| WO | 2010064186 A1 | 6/2010 |
| WO | 2011117814 A1 | 9/2011 |

\* cited by examiner

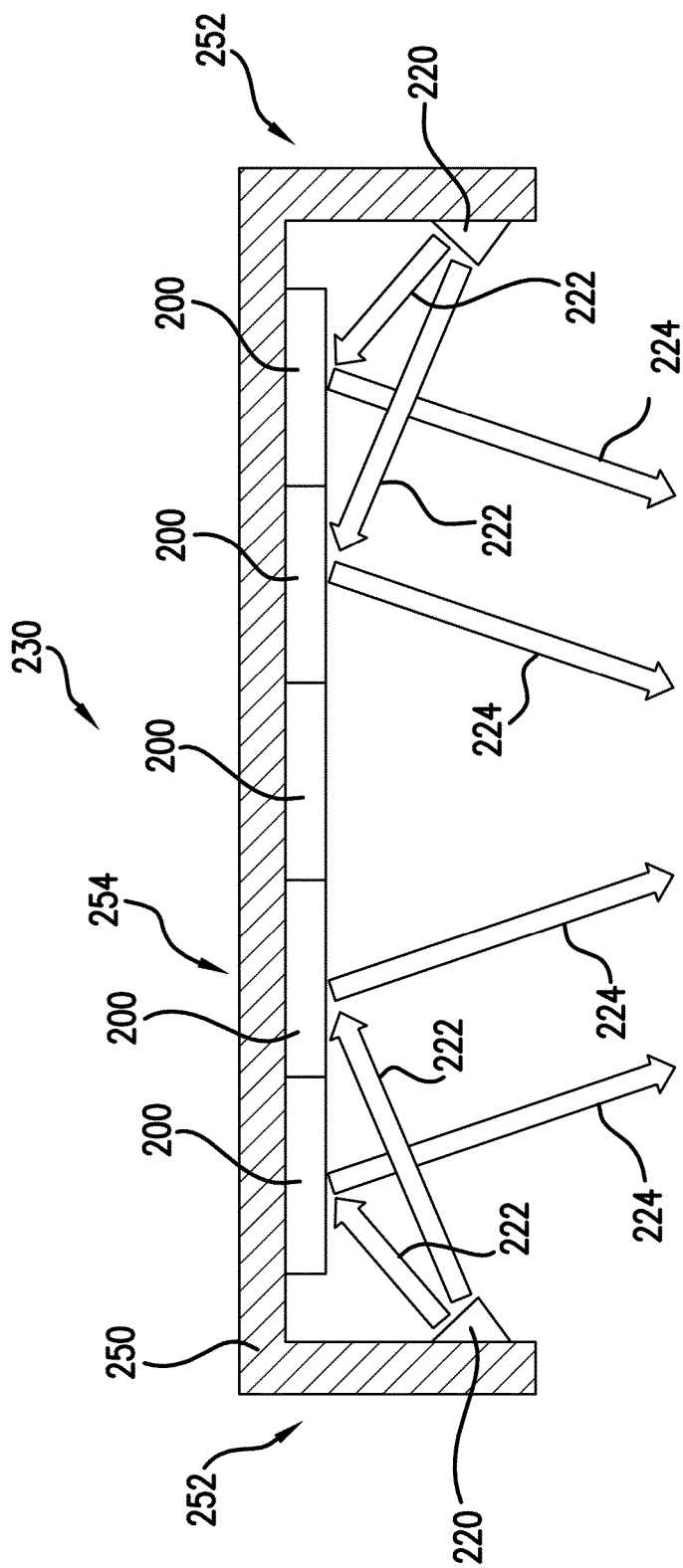

COLOR MIXING USING THE REFLECTIVE PROPERTIES OF OLEDS

FIELD OF THE INVENTION

The subject matter of the present disclosure relates generally to color mixing using the reflective properties of OLEDS.

BACKGROUND OF THE INVENTION

An organic light-emitting diode device, also called an OLED, commonly includes an anode, a cathode, and an organic electroluminescent unit sandwiched between the anode and the cathode, all of which is disposed on a substrate. The substrate is often made from a transparent material such as plastic or glass. The organic electroluminescent unit generally includes a hole-transporting layer, a light-emitting layer, and an electron-transporting layer, among others. A power source is attached to the anode and cathode. OLEDs are attractive as a light source in lighting applications because of e.g., their low drive voltage, high efficiency, high luminance, long life, thin profile, large-area diffuse light emission, and ability to be shaped into a curved configuration if disposed on a flexible substrate.

When a proper voltage is applied, the anode injects holes and the cathode injects electrons into the organic electroluminescent unit. The injected holes and electrons each migrate toward the oppositely charged electrode. When an electron and hole localize on the same molecule, an "exciton" is produced, which is a localized electron-hole pair having an excited energy state. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

OLEDs can emit different colors, such as red, green, blue, or white, depending on the emitting property of its light emitting layer. OLEDs emitting white light often contain individual colored emitters, such as a red-emitting dye, a blue emitting dye, and a green emitting dye, such that when the emission from the individual dyes is combined, the resultant light emission is white light. Efficient white light producing OLED devices are considered a low cost alternative for several applications such as paper-thin light sources, backlights in LCD displays, automotive dome lights, office lighting, and the like. White light producing OLED devices should be bright, efficient, and generally have Commission International d'Eclairage (CIE) chromaticity coordinates of about (0.33, 0.33), although this can vary significantly depending on the desired color temperature for the application. Light sources that emit radiation with a correlated color temperature (CCT) in the range of 2500 K to 7000 K are generally considered to be white light sources, although this range is not deemed to be limiting.

Certain challenges exist, however, with the manufacture and use of OLEDs. It is very challenging to manufacture OLEDs of various CCT that have the desired performance characteristics described above, e.g. high brightness, high efficiency, long life, etc. There have been demonstrations of individually colored OLEDs of red, green, and blue having extremely long life and high efficiency but when trying to combine them into a single white light source the performance characteristics often drop significantly. It is advantageous to optimize an OLED stack, e.g. anode, cathode, transport layer(s) and emission layer(s) based on a specific emitter of a specific wavelength, as the performance will often be increased if the microcavity is tuned for that specific dye. Design considerations such as material composition and thickness of the various layers must be accounted for. Additionally, the materials chosen in the stack should be compatible from both a chemistry and energy level/transfer perspective. As such, when trying to make an OLED with multiple emitters to generate a white light source, it is difficult to optimize and achieve the same performance characteristics of individually colored OLEDs that could have their emitted light mixed to achieve the same color.

Due to the complex energy transfer mechanisms involved in white OLEDs that contain multiple dyes, one cannot simply change the relative concentrations of the dyes to achieve a different CCT of white light. Therefore, from a design and manufacturing standpoint, each white OLED of different CCT would need to be optimized in the lab from a performance standpoint and then optimized from a manufacturing standpoint. If color mixing in a luminaire is utilized as described herein, only the individually colored OLEDs, such as red, blue, and green would need to be optimized and manufactured. The relative intensities of each component would then be selected based on relative intensity, power, and distance, to generate white light that is capable of having a broad range of CCTs. As an alternative, a white OLED could be tuned via color mixing with one or more individually colored OLEDs to achieve the particular CCT desired for the application.

Lastly, due to the fact the OLEDs are a more recent lighting technology, material sets that allow for all of the color space at high performance does not exist. For example, deep blue dyes are not as mature from a performance standpoint when compared to green dyes that are used in OLEDs.

Accordingly, a method of increasing the color space available when illuminating with one or more OLEDs would be useful.

BRIEF DESCRIPTION OF THE INVENTION

Aspects and advantages of the invention will be set forth in part in the following description, or may be obvious from the description, or may be learned through practice of the invention.

In one exemplary embodiment, the present invention provides a method of color mixing using an OLED. The method includes the steps of directing a first light from a first light source toward the OLED, wherein the first light has a first color; reflecting the first light from the first light source on a reflective layer in the OLED to form a reflected light; emitting a second light from the OLED, wherein the second light has a second color; and combining the reflected light with the second light to form a third light, wherein the third light has a third color that is different than the first color and the second color.

In still another exemplary embodiment, the present invention provides a method of changing a color temperature of an OLED light source. The method includes the steps of providing the OLED light source with a reflective component; reflecting a diffused light of a first color on the reflective component of the OLED light source; and, emitting light of a second color from the OLED light source to provide a third color of light that is different from the first color and the second color.

In one exemplary embodiment of the present invention, a color tunable, light emitting device is provided that includes a primary substrate and a first light source providing a first light color. The first light source is positioned upon the primary substrate. A second light source provides a second light color. The second light source includes an OLED having a reflective surface. The first light source is positioned to direct light towards the reflective surface of the OLED so as to provide a third light color from the light emitting device. A means for adjusting the relative intensities of the first light and second light can be provided to effectively tune the color of the combined light emitted from the reflective surface.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 3 illustrates an end view of another exemplary embodiment of the present invention.

DETAILED DESCRIPTION OF THE INVENTION

Figure 1:
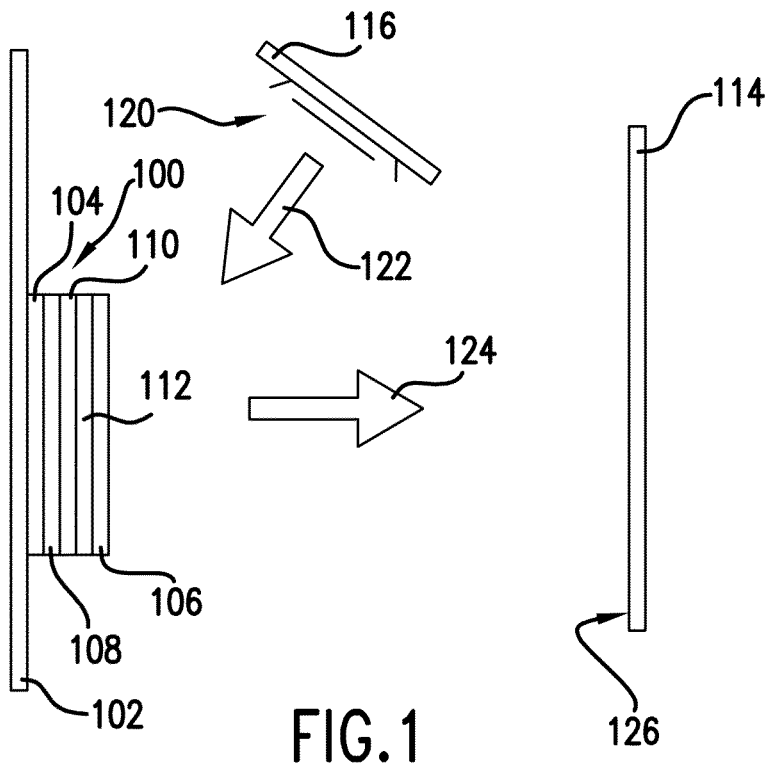
FIG. 1 provides a schematic representation of an exemplary embodiment of the present invention.

The present invention provides for color mixing using the reflective properties of an OLED. More particularly, at least one OLED is used to reflect light from at least one other light source such that light from the OLED and the additional light source are combined. Light from the additional light source is reflected from a surface in the OLED provided by e.g., the cathode of the OLED. By carefully selecting the individual light colors of the OLED and the additional light source, their combined light can provide a light color different from either the OLED or the additional light source alone.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

FIG. 1 provides a schematic representation of an exemplary embodiment of a luminaire of the present invention. As shown, a first light source 120 directs light 122 toward a second light source 100. Represented by an arrow, light 122 has a first color that is determined e.g., by the construction of first light source 120. The first light source 120 may be a single color light source.

For this exemplary embodiment, first light source 120 can be selected from a variety of different light source types. For example, first light source 120 could include an incandescent, fluorescent, LED, or OLED light source as well as combinations thereof. Also, first light source 120 could include multiple lights sources such as e.g., a plurality of incandescent bulbs, a strip of LEDs or OLEDs, or combinations thereof. In one embodiment of the invention, first light source 120 includes a strip of red, green, and blue LEDs that can be independently activated. First light source 120 is connected to e.g., a controllable power source (not shown) and may be mounted onto a primary substrate 116.

First light source 120 could also be used to direct diffused light towards second light source 100. For example, a diffuser plate or screen (not specifically shown) could be positioned between first light source 120 and second light source 100 to diffuse or scatter light from source 120.

In the exemplary embodiment of FIG. 1, second light source 100 is constructed as an OLED. More specifically, second light source 100 includes a cathode 104 and an anode 106, which are also connected to e.g., a controllable power source (not shown). OLED 100 includes an electroluminescent unit which may be constructed from layers 108, 110, and 112 as will be further described. Second light source 100 is mounted onto a secondary substrate 102.

Cathode 104 may be constructed from a thin metal film that is highly reflective. For example, in certain embodiments, cathode 104 can reflect at least about 80 percent of the light directed towards it from first light source 120. Examples of metals that may be used for the reflective cathode 104 include e.g., hafnium, aluminum, silver, gold, zinc, and other reflective metals—preferably metals having a relatively low work function. Accordingly, other materials may be used for the construction of cathode 104 as well. Upon connection to a voltage source, cathode 104 provides electrons to e.g., layers 108 and 110.

In the embodiment of FIG. 1, anode 106 is preferably constructed from a material (optionally having a high work function) that is also substantially transparent so that light may propagate out of the OLED or second light source 100. Upon connection to a voltage source, anode 106 provides holes to e.g., layers 110 and 112. The anode 106 may include e.g., indium tin oxide, tin oxide, nickel, or gold. Various other oxides (e.g., other transparent oxides) may also be used such as e.g., a lanthanide oxide. The lanthanide oxide may include one or more lanthanides and may further include other elements as a mixed oxide. The lanthanide oxide may include a lanthanide selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and combinations thereof.

OLED 100 may include an electron injection layer 108, a hole transport layer 112, as well as light emission layer 110. For the exemplary embodiment of FIG. 1, the electron injection layer 108 is disposed directly adjacent the cathode 104, creating a cathode bi-layer. The association of electron injection layer 108 with the cathode 104 in a bi-layer improves the efficiency of electron injection and may help reduce the decay of organic material in the OLED. Electron injection layer 108 may have a thickness of at least 0.01 nm or, for example, at least 0.1 nm. In one exemplary embodiment, the thickness of electron injection layer 108 is no greater than 5 nm or, for example, about 2 nm. Electron injection layer 108 may comprise a magnetic metal halide. The magnetic metal halide may be selected from the group consisting of, but not limited to, halides of nickel, silver, chromium, manganese, cesium, iron and combinations thereof. Magnetic materials improve the efficiency of electron injection. In one embodiment, the halide is chosen from fluoride, iodide, or a combination thereof, although other halides may be used. The magnetic metal halide may be present in electron injection layer 108 as a combination with other materials.

For the exemplary embodiment of FIG. 1, light emission layer 110 spaces the hole transport layer 112 from the electron injection layer 108. Light emission layer 110 may comprise any material which is capable of exhibiting electroluminescence, including many known organic electroluminescent materials. In one exemplary embodiment, the light emission layer comprises tris(8-hydroxyquinoline) aluminum (III) ($Alq_3$). This material may be doped with one of platinum, nickel or chromium octaethylporphyrin, or a combination thereof, e.g., $Alq_3$ doped with nickel octaethylporphyrin (NiOEP) in an amount of at least 1% by weight nickel, e.g., about 5 wt. %.

Hole transport layer 112 may be an organic layer that is readily able to transport the holes supplied by the anode 106. In one exemplary embodiment, the organic hole transport layer 112 includes a triarylamine, such as naphthyl-substituted benzidine derivative, such as 4,4'-bis[N-(1-naphthyl-D-N-phenyl-amino]-biphenyl (alpha NPD), N,N'(3-methylphenyl)-1,1"-biphenyl-4,4'-diamine, (TPD), or a mixture thereof. Hole transport layer 112 may have a thickness of approximately 60 nm. It is to be appreciated however, that numerous other organic materials, and other layer thickness, could be used to achieve desired characteristics.

Secondary substrate 102 provides support for the second light source or OLED 100. Substrate 102 may comprise any suitable material known in the art, such as e.g., glass, plastic, metal or silicon. Although FIG. 1 shows an exemplary embodiment in which the cathode is mounted to the secondary substrate 102, it should be understood that substrate 102 could be placed on the other side of OLED 100 such that e.g., anode 106 is mounted to secondary substrate 102. In such an embodiment, preferably secondary substrate 102 would be optically transparent, allowing light generated in OLED 100 to pass through.

In one exemplary embodiment, secondary substrate 102 has e.g., a thickness of at least about 0.1 mm or, for example, less than about 1.5 mm. By way of additional example, secondary substrate 102 may have a thickness of about 0.7 mm. Optionally, secondary substrate 102 may be coated with a compliance and/or heat absorbing layer such as a mixture comprising vinylidene fluoride, trifluoroethylene and a phthalocyanine compound. As an example, such layer may comprise 70% vinylildene fluoride-trifluoroethylene and 30% gold phthalocyanine; however other known materials may be used.

It should be understood that the primary substrate 116 and secondary substrate 102 could be separate components as shown in FIG. 1. As such, these substrates 116 and 102 are positioned relative to each other so that their separation distance and angle provides for the combined (emitted and reflected) third light 124. However, in an alternative exemplary embodiment, substrate 102 and 116 could be a single substrate onto which both the first light source 120 and second light source 100 are mounted or supported. In such case, the single substrate would be bent or otherwise shaped to provide the appropriate distance and angle between the first and second light sources 120 and 100, respectively.

The materials for layers 108, 110, 112, or anode 106 and cathode 104, as mentioned above are suitably deposited through any method known and commonly used in the art, such as vacuum deposition, thermal evaporation, vapor-phase deposition and inkjet printing. The various layers 108, 110, 112 and anode 106 and cathode 104, for this exemplary OLED 100, can be laid down on the substrate by a variety of techniques, such as thermal deposition, chemical vapor deposition, ink jet printing techniques, solvent deposition, and combinations thereof. It should be understood that the size, proportion, and relative placement of the layers of OLED 100 shown in FIG. 1 are by way of example only and other configurations may be used as well.

Upon activation of first light source 120 and second light source 100, a first light 122 of a first color is directed towards second light source 100. This first light 122 is then reflected from the reflective layer of second light source 100, which in this example is the cathode 104 of the OLED that provides second light source 100. The reflective layer may be curved to direct the reflected light in a desired direction. This reflected light is then combined with a second light of a second color that is emitted from the OLED to provide a third light 124 of a third color. As shown, this third light 124 can be used to e.g., illuminate the surface 126 of an object 114 that may be e.g., a wall, sidewalk, a desk, and other examples as well.

Accordingly, the identity of the first light source 120 and second light source 100 can be selected to determine the third color of third light 124. More particularly, by choosing light sources 120 and 100 that provide a known first color 122 and a known second color (from source 100), the third light 124 can be determined as yet a third light color based on mixing of the reflected first light 120 and the second light from second light source 100. Preferably, the maximum straight line distance between first light source 120 and second light source 100 should be about 122 cm. Also, preferably the third light 124 has a color shift of at least about 100K (up or down), for example, from about 200 K to about 1000 K, when compared to light emitted from second light source 100 alone.

Such color mixing e.g., allows a manufacturer to achieve light colors not previously available using only OLEDs as a light source. More specifically, because the range of color space currently available from OLEDs is limited, color mixing as described above allows an increase in the range of colors that are available. In turn, this can provide e.g., luminaires more desirable to the end purchaser as well as reduce manufacturing burdens that can be associated with other methods for providing similar color space such as increased equipment or inventory costs. Therefore, by using a color mixing scheme of an OLED with a light source that is more developed, such as an inorganic light emitting diode (LED), one can open up the overall color space that is achievable for OLED applications. Additionally, using a color mixing scheme of individually optimized light sources can result in an overall higher performance, e.g. efficiency and life, when compared to a single white light source. Another benefit is being able to change the color temperature of the light source by manipulating the relative intensities of the light sources. Similarly, a luminaire that can use an OLED and one or more additional light sources would increase the color space that would result from the use of the OLED alone.

Additionally, more than one light color can be achieved with a luminaire or other lighting device that incorporates color mixing using a reflective component of an OLED as described above. For example, where first light source 120 is provided as a strip of LEDs of different colors, different LEDs can be activated to change the color of the resulting third light 124. More particularly, where first light source 120 is provided as e.g., a strip of red, green, and blue LEDs that may each be independently activated, a different third light 124 may be provided depending on which of the LEDs is/are activated.

Exemplary embodiments of the present invention may be provided with features for modulating one or more parameters to change the combined light output. Such features may allow for manual adjustments by the user and/or may involve automated adjustments based on e.g., environmental feedback to a control loop. For example, color changes may also be obtained by modifying the output of one or more light sources used for first light source 120. By varying the intensity of the output from first light 122, the color of third light 124 may be varied. This could be accomplished e.g., by controlling the amount of voltage applied to one or more LEDs provided as first light source 120. Similarly, color changes may be obtained by modifying the output of OLED 100 as well.

Figure 2:
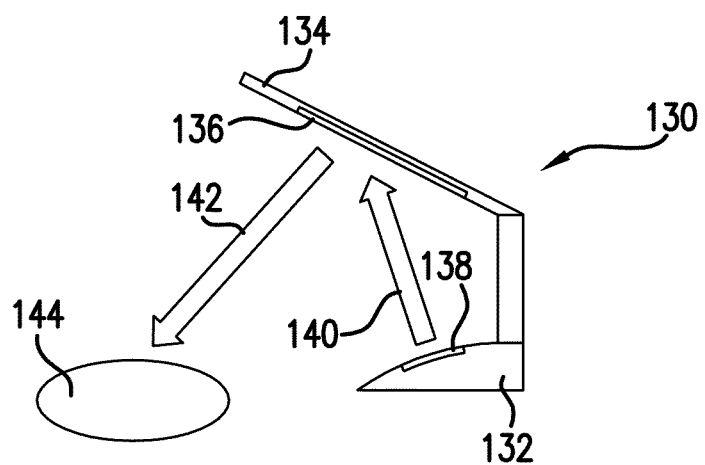
FIG. 2 is a schematic illustration of an exemplary embodiment of a luminaire of the present invention.

As will be understood by one of ordinary skill in the art using the teachings disclosed herein, a variety of luminaires can be provided that utilize color mixing with an OLED as previously described. By way of example only, FIG. 2 provides an exemplary embodiment of a desk lamp 130 of the present invention. Base 132 of lamp 130 includes an OLED 138 that e.g., may provide colored light such as a blue light 140. Arm 134 of desk lamp 130 includes another OLED 136 that provides a white light and includes a reflective electrode such as e.g., a cathode made from a thin film of reflective metal.

Accordingly, when desk lamp 130 is activated, first light 140 is directed towards the reflective element in the OLED 136 of arm 134. This reflected light combines with the white light from OLED 136 to provide a third light 142 onto surface 144 that is of a different light color than would be emitted from either first light 140 or the light emitted from OLED 136 if used alone. Other configurations for a luminaire may be applied as well. Lamp 130 can also provide aesthetic appeal to a purchaser or user. For example, the colored OLED in the base of the lamp provides an attractive, modern design that would be attractive to certain consumers.

FIG. 3 provides a side view of another exemplary luminaire 230 of the present invention as might be mounted e.g., to a ceiling to provide an overhead light. For example, substrate 250 provides a frame that could be mounted to the ceiling or other support structure to suspend luminaire 230. Again, the shape and structure of luminaire 230 is provided by way of example only—other configurations may be constructed using the teachings disclosed herein.

Luminaire 230 includes a plurality of first light sources 220 positioned on both sides 252 of substrate 250. First light sources 220 provide a first light 222 that is directed towards a plurality of OLEDs 200 mounted to a top portion 254. As previously described, first light 222 reflects from a reflective layer in OLEDs 200 and combines with a second light emitted from OLEDs 200 to provide a third light 224 of a third color that is different from the first color and the second color. In a manner similar to that described with regard to FIG. 1, variations in the light from first light sources 220 and/or OLEDs 200 can be used to provide different light colors and other effects.

Without intending to limit the scope of the invention, the following example demonstrates light mixing using the reflective properties of an OLED.

EXAMPLE

A first white OLED was positioned 27 cm from a white surface and operated with a 50 mA drive current while directed toward the white surface. A second blue OLED was positioned 10 cm away from the first white OLED and directed so as to illuminate the first white OLED and reflect off of the first white OLED towards the white surface. A Radiant Imaging camera was positioned normal to the white surface. Table I shows the measurement results with only the first white OLED activated while Table II shows the results with both OLEDs activated to provide a combined light directed towards the white surface.

TABLE I

| Luminance (cd/m$^2$) | ccx | ccy | CCT (K) |
|---|---|---|---|
| 7.89 | 0.416 | 0.429 | 3562 |

TABLE II

| Luminance (cd/m$^2$) | ccx | ccy | CCT (K) |
|---|---|---|---|
| 9.79 | 0.353 | 0.415 | 4927 |

As indicated by the results, the light incident on the white surface is well mixed with a resulting shift in color coordinates—indicating that light from the second blue OLED has reflected off the first white OLED and mixed with light from the first white OLED to provide a third light color different from the color of either the first white OLED or the second blue OLED.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of color mixing, the method comprising:
directing a first light from a first light source toward a white OLED device, wherein the first light has a first color, said first light source comprising a red, green, or blue inorganic LED, wherein the first light is diffused;
reflecting the first light from the first light source on a reflective layer in the OLED device to form a reflected light;
emitting a white second light from the OLED device, wherein the second light has a second color; and
combining the reflected light with the second light to form a third light, wherein the third light has a third color that is different than the first color and the second color.

2. A method of color mixing according to claim 1, wherein the reflective layer in the OLED device is an electrode of the OLED device.

3. A method of color mixing according to claim 1, wherein the reflective layer in the OLED device is a cathode of the OLED device.

4. A method of color mixing according to claim 1, wherein the reflective layer is curved to direct the reflected light in a desired direction.

5. A method of changing a color temperature of a white OLED device, the method comprising:
reflecting a diffused light of a first color on a reflective component of a white OLED device, the light of a first color emitted by a red, green, or blue inorganic LED; and,
emitting white light of a second color from the OLED device, to provide a third light from combined reflected light and said white light, said third light comprising a color temperature different from the white light of the second color.

6. A method of changing a color temperature as in claim 5, wherein the reflective component is an electrode of the white OLED device.

7. A method of changing a color temperature as in claim 5, wherein the reflective component is a cathode of the white OLED device.

8. A method of changing a color temperature as in claim 5, wherein the third light has a color shift of at least about 100K when compared to the white light emitted from the OLED device.

9. A color tunable, light emitting device, comprising:

a primary substrate;

a first light source providing a diffused first light color; said first light source positioned upon the primary substrate, said first light source comprising a red, green, or blue inorganic LED and further comprising a diffuser; and, a second light source providing a second light color, said second light source comprising a white OLED device having a reflective surface, wherein said first light source is positioned to direct light towards the reflective surface of the OLED device so as to provide a third light color from the color tunable, light emitting device.

10. A color tunable, light emitting device as in claim 9, wherein said second light source is also located on said primary substrate, and wherein said substrate is shaped to direct light from said first light source towards the reflective surface of the OLED device in said second light source.

11. A color tunable, light emitting device as in claim 9, further comprising a secondary substrate onto which said second light source is positioned.

12. A color tunable, light emitting device as in claim 9, wherein said first light source comprises an LED panel having red, green, and blue inorganic LEDs.

13. A color tunable, light emitting device as in claim 9, wherein a maximum straight line distance between first light source and second light source is about 122 cm.

* * * * *